United States Patent
Park et al.

(10) Patent No.: US 10,573,699 B2
(45) Date of Patent: Feb. 25, 2020

(54) LARGE AREA ULTRA HIGH DENSITY FLAT DISPLAY HAVING HIGH APERTURE RATIO

(71) Applicant: LG DISPLAY CO., LTD., Seoul (KR)

(72) Inventors: Eunji Park, Wonju-si (KR); Kilhwan Oh, Seoul (KR); Kihyung Lee, Yongin-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/818,032

(22) Filed: Nov. 20, 2017

(65) Prior Publication Data

US 2018/0145121 A1    May 24, 2018

(30) Foreign Application Priority Data

Nov. 21, 2016 (KR) .................. 10-2016-0155266

(51) Int. Cl.
*G06F 1/00*      (2006.01)
*H01L 27/32*     (2006.01)
*G09G 3/3225*    (2016.01)
*H01L 27/12*     (2006.01)

(52) U.S. Cl.
CPC ....... *H01L 27/3262* (2013.01); *G09G 3/3225* (2013.01); *H01L 27/124* (2013.01); *H01L 27/326* (2013.01); *H01L 27/3246* (2013.01); *G09G 2300/043* (2013.01); *G09G 2300/0426* (2013.01); *G09G 2300/0452* (2013.01); *G09G 2300/0814* (2013.01); *G09G 2320/0219* (2013.01); *G09G 2320/0295* (2013.01); *H01L 27/3213* (2013.01); *H01L 27/3276* (2013.01)

(58) Field of Classification Search
CPC .................................. G09G 5/10; G09G 3/20
See application file for complete search history.

(56) References Cited

U.S. PATENT DOCUMENTS

| 9,202,855 B1 | 12/2015 | Jo et al. |
| 2007/0176859 A1 | 8/2007 | Cok et al. |
| 2008/0297448 A1 | 12/2008 | Mizukoshi et al. |
| 2010/0231615 A1* | 9/2010 | Tokuda ................ G09G 3/3233 345/690 |

(Continued)

FOREIGN PATENT DOCUMENTS

KR    10-2014-0080312 A    6/2014

*Primary Examiner* — Michael A Faragalla
(74) *Attorney, Agent, or Firm* — Birch, Stewart, Kolasch & Birch, LLP

(57) ABSTRACT

The present disclosure relates to a large area ultra high density flat panel display having a high aperture ratio. The present disclosure provides a flat panel display including a driving current line and a sensing line disposed in a first direction on a substrate; a scan line and a sensing gate line disposed in a second direction on the substrate; a horizontal current line disposed at upper side of the scan line in the second direction and connected to the driving current line; a horizontal sensing line disposed at lower side of the sensing gate line in the second direction and connected to the sensing line; a common current line branched from the horizontal current line and crossing the scan line; and a first pixel area and a second pixel area disposed between the driving current line and the sensing line as having a bi-symmetric shape with each other based on the common current line.

18 Claims, 6 Drawing Sheets

(56) References Cited

U.S. PATENT DOCUMENTS

| | | |
|---|---|---|
| 2012/0026144 A1 | 2/2012 | Kang et al. |
| 2012/0153293 A1* | 6/2012 | Koyama .............. G09G 3/3225 257/72 |
| 2014/0184579 A1 | 7/2014 | Kim et al. |
| 2015/0049075 A1 | 2/2015 | Lim et al. |
| 2015/0379939 A1 | 12/2015 | Takasugi et al. |
| 2016/0099293 A1 | 4/2016 | Jung et al. |
| 2016/0365037 A1* | 12/2016 | Gu ....................... G09G 3/3291 |

* cited by examiner

LARGE AREA ULTRA HIGH DENSITY FLAT DISPLAY HAVING HIGH APERTURE RATIO

CROSS-REFERENCE TO RELATED APPLICATIONS

This application claims the priority benefit of Korea Patent Application No. 10-2016-0155266 filed on Nov. 21, 2016 in the Republic of Korea, which is incorporated herein by reference for all purposes as if fully set forth herein.

BACKGROUND OF THE INVENTION

Field of the Invention

The present disclosure relates to a large area ultra high density flat panel display having a high aperture ratio. Especially, the present disclosure relates to a large area ultra high density organic light emitting diode display having a superior video quality in which the line load is lowered or minimized.

Discussion of the Related Art

Nowadays, various flat panel displays (FPDs) are developed for overcoming many drawbacks of the cathode ray tube (CRT) which is heavy and bulky. The flat panel display devices include the liquid crystal display (LCD) device, the field emission display (FED), the plasma display panel (PDP), the electro-luminescence (EL) device and so on.

As a self-emitting display device, the electro-luminescence device has the merits that the response speed is very fast, the brightness is very high and the view angle is large. The electro-luminescence device can be categorized an inorganic light emitting diode display and an organic light emitting diode display. As having the good energy efficiencies, the lower leaked current and the easiness for representing color and brightness by current controlling, the OLED using the organic light emitting diode is more required.

FIG. 1 is a diagram illustrating the structure of an organic light emitting diode according to a related art. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode radiates the lights due to the energy from the exciton formed at the excitation state in which the hole and the electron are recombined at the emission layer EML.

The organic light emitting diode radiates the lights due to the energy from the exciton formed at the excitation state in which the hole from the anode and the electron from the cathode are recombined at the emission layer EML. The organic light emitting diode display can represent the video data by controlling the amount (or "brightness") of the light generated and radiated from the emission layer ELM of the organic light emitting diode as shown in FIG. 1.

The OLED using the organic light emitting diode having the good energy efficiencies can be categorized into the passive matrix type organic light emitting diode display (PMOLED) and the active matrix type organic light emitting diode display (AMOLED).

The active matrix type organic light emitting diode display (AMOLED) shows the video data by controlling the current applying to the organic light emitting diode using the thin film transistor (TFT). Hereinafter referring to FIGS. 2 and 3, we will explain about the organic light emitting diode display according to the related art.

FIG. 2 is the exemplary circuit diagram illustrating the structure of one pixel in the active matrix organic light emitting diode display (AMOLED). FIG. 3 is a plane view illustrating the structure of the AMOLED according to the related art. FIG. 4 is a cross sectional view along the cutting line I-I' for illustrating the structure of the bottom emission type AMOLED according to the related art.

Referring to FIGS. 2 and 3, the active matrix organic light emitting diode display comprises a switching thin film transistor ST, a driving thin film transistor DT connected to the switching thin film transistor ST, and an organic light emitting diode OLE connected to the driving thin film transistor DT. By depositing a scan line SL, a data line DL and the driving current line VDD on a substrate, a pixel area is defined. As an organic light emitting diode is disposed within the pixel area, it defines an emission area.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the scan line SL, a semiconductor channel layer SA overlapping with the gate electrode SG, a source electrode SS and a drain electrode SD. The driving thin film transistor DT acts for driving an anode electrode ANO of the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. Between the anode electrode ANO and the cathode electrode CAT, an organic light emitting layer OL is disposed. The base voltage VSS is supplied to the cathode electrode CAT. A storage capacitance Cst is formed between the gate electrode DG of the driving thin film transistor DT and the driving current line VDD or between the gate electrode DG of the driving thin film transistor DT and the drain electrode DD of the driving thin film transistor DT.

Referring to FIG. 4, we will explain about the bottom emission type organic light emitting diode display. On the substrate SUB of the active matrix organic light emitting diode display, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the drain contact hole DH penetrating the gate insulator GI. The passivation layer PAS is deposited on the substrate SUB having the switching thin film transistor ST and the driving thin film transistor DT.

The upper surface of the substrate having these thin film transistors ST and DT is not in even and/or smooth conditions, but in uneven and/or rugged conditions having many steps. In order to get best light emitting efficiency, the organic light emitting layer OL would be deposited on an even or planar surface. So, to make the upper surface in planar and even conditions, the over coat layer OC is deposited on the whole surface of the substrate OC.

Then, on the over coat layer OC, the anode electrode ANO of the organic light emitting diode OLE is formed. Here, the anode electrode ANO is connected to the drain electrode DD of the driving thin film transistor DT through the pixel contact hole PH penetrating the over coat layer OC and the passivation layer PAS.

On the substrate SUB having the anode electrode ANO, a bank BA is formed over the area having the switching thin film transistor ST, the driving thin film transistor DT and the various lines DL, SL and VDD, for defining the light emitting area. The exposed portion of the anode electrode ANO by the bank BA would be the light emitting area. On the organic light emitting layer OL, a cathode electrode CAT is deposited.

A spacer (not shown) may be disposed on the substrate SUB having the cathode electrode CAT. It is preferable that the spacer is disposed on the bank BA, non-emission area. With the spacer, an en-cap is joined on the lower substrate SUB. For attaching the en-cap and the lower substrate SUB, an adhesive layer or adhesion material (not shown) would be deposited there-between.

For the bottom emission type organic light emitting diode display, the lights from the organic light emitting layer OL would be radiated to the lower substrate SUB. Therefore, it is preferable that a color filter CF is disposed between the overcoat layer OC and the passivation layer PAS and the anode electrode ANO includes a transparent conductive material. Further, the cathode electrode CAT preferably includes a metal material having the high reflection property for reflecting the lights from the organic light emitting layer OL to bottom side. In addition, the organic light emitting layer OL and the cathode electrode CAT would be deposited as covering the whole surface of the substrate.

The cathode electrode CAT is supplied with the reference voltage of the organic light emitting diode OLE. For ensuring the stable operation of the organic light emitting diode OLE, the reference voltage should be kept in stable voltage without flickers. To do so, it is preferable that the cathode electrode CAT has the low resistance metal material and is deposited over the whole surface of the substrate SUB.

When the organic light emitting diode display according to the related art is used for a long time, the video quality may be degraded due to the change of the electric characteristics of the pixels. The compensation elements for recovering these defects are required by detecting the changes of the electric characteristics.

In the cases that these compensation elements or circuits are installed into the pixel area, it may cause the reduction of the aperture ratio which is the ratio of the emission area to the pixel area. For the ultra high resolution display including UHD or 4K, the pixel area includes the switching thin film transistor, the driving thin film transistor and the compensation thin film transistor so that the aperture ration is remarkably reduced. It is required that the new structure of the organic light emitting diode display which ensures the high aperture ratio with the ultra high density resolution.

SUMMARY OF THE INVENTION

In order to overcome or address the above mentioned drawbacks, a purpose of the present disclosure is to provide an ultra high density organic light emitting diode display having a high aperture ratio. Another purpose of the present disclosure is to provide a flat panel display that in which the signal delay is not occurred by reducing the load of the scan line. Still another purpose of the present disclosure is to provide a large area flat panel display having the superior video quality by reducing the signal delay.

In order to accomplish the above purpose, the present disclosure provides a flat panel display including a driving current line and a sensing line disposed in a first direction on a substrate; a scan line and a sensing gate line disposed in a second direction on the substrate; a horizontal current line disposed at upper side of the scan line in the second direction and connected to the driving current line; a horizontal sensing line disposed at lower side of the sensing gate line in the second direction and connected to the sensing line; a common current line branched from the horizontal current line and crossing the scan line; and a first pixel area and a second pixel area disposed between the driving current line and the sensing line as having a bi-symmetric shape with each other based on the common current line.

In one embodiment, the flat panel display further includes a switching thin film transistor overlapped with the scan line; a driving thin film transistor disposed between the scan line and the sensing gate line, and connected to the switching thin film transistor; and a sensing thin film transistor overlapped with the sensing gate line.

In one embodiment, the switching thin film transistor includes a switching source electrode branched from the data line; a switching drain electrode facing the switching source electrode based on the scan line; and a switching semiconductor layer crossing the scan line, wherein one end of the switching semiconductor layer is connected to the switching source electrode and another end of the switching semiconductor layer is connected to the switching drain electrode.

In one embodiment, the driving thin film transistor includes a driving source electrode branched from the common current line; a driving gate electrode connected to the switching drain electrode; a driving drain electrode facing the driving source electrode based on the driving gate electrode; and a driving semiconductor layer crossing the drain gate electrode, wherein one end of the driving semiconductor layer is connected to the driving source electrode and another end of the driving semiconductor layer is connected to the driving drain electrode.

In one embodiment, the sensing thin film transistor includes a sensing source electrode branched from the horizontal sensing line; a sensing drain electrode facing the sensing source electrode based on the sensing gate line, and connecting to the driving drain electrode; and a sensing semiconductor layer crossing the sensing gate line, wherein one end of the sensing semiconductor layer is connected to the sensing source electrode and another end of the sensing semiconductor layer is connected to the sensing drain electrode.

In one embodiment, the flat panel display further includes an anode electrode connected to the driving thin film transistor and disposed within the first pixel area; a bank defining an emission area within the anode electrode; an organic light emitting layer disposed on the emission area; and a cathode electrode disposed on the organic light emitting layer.

In one embodiment, the flat panel display further includes a third pixel area and a fourth pixel area disposed as having a bi-symmetric shape with the first pixel area and the second pixel area based on the common current line.

In one embodiment, a red pixel is allocated at the first pixel area, a white pixel is allocated at the second pixel area, a green pixel is allocated at the third pixel area; and a blue pixel is allocated at the fourth pixel area.

In one embodiment, the common current line includes a first common current line supplying a driving current to the first pixel area and the second pixel area; and a second common current line supplying the driving current to the third pixel area and the fourth pixel area.

In one embodiment, the first common current line and the second common current line are overlapped with the scan line within an unit pixel area including the first pixel area, the second pixel area, the third pixel area and the fourth pixel area.

The organic light emitting diode display according to the present disclosure includes a compensation thin film transistor for controlling the conditions of the driving thin film transistor and/or the organic light emitting diode by detecting the degradation of the pixel. Under the hard condition causing the deterioration of the pixel, the video quality can be kept in superior quality. Further, according to the present disclosure, the number of the lines or electrodes overlapped with the scan line is reduced. Therefore, the amount of the parasitic capacitance occurred at the lines or electrodes overlapped with the scan line are reduced. As the results, the load to the scan line is reduced and the scan signal can be applied to the whole area of the flat panel display without signal delay. Specifically, without the delay of the scan signal, for the large area organic light emitting diode display, the superior video quality can be ensured.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

In the drawings.

DETAILED DESCRIPTION OF THE EMBODIMENTS

Figure 1:
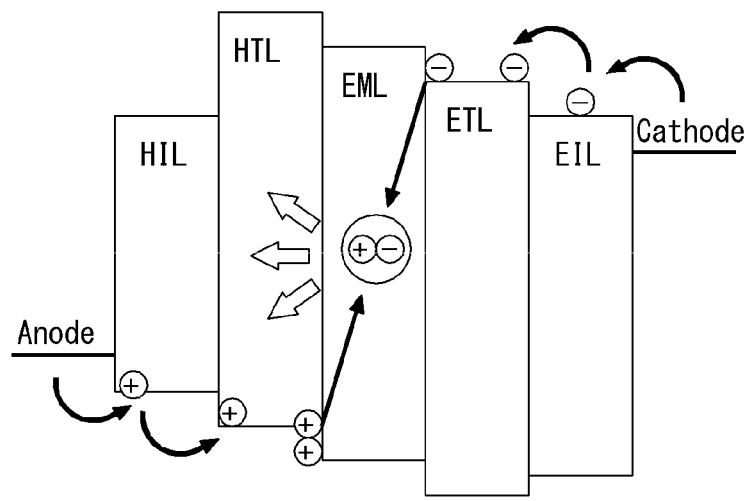
FIG. 1 is a diagram illustrating the structure of an organic light emitting diode according to the related art.
Figure 2:
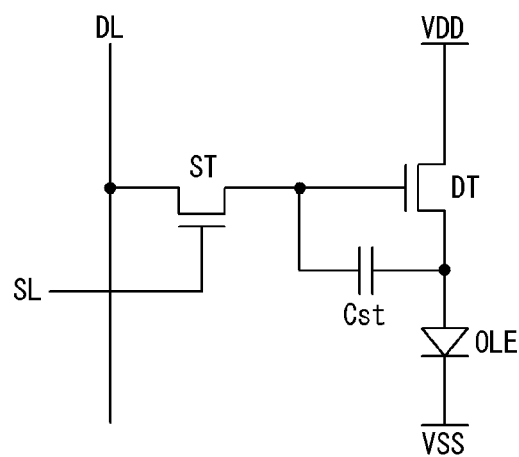
FIG. 2 is the exemplary circuit diagram illustrating the structure of one pixel in the active matrix organic light emitting diode display (AMOLED) according to the related art.
Figure 3:
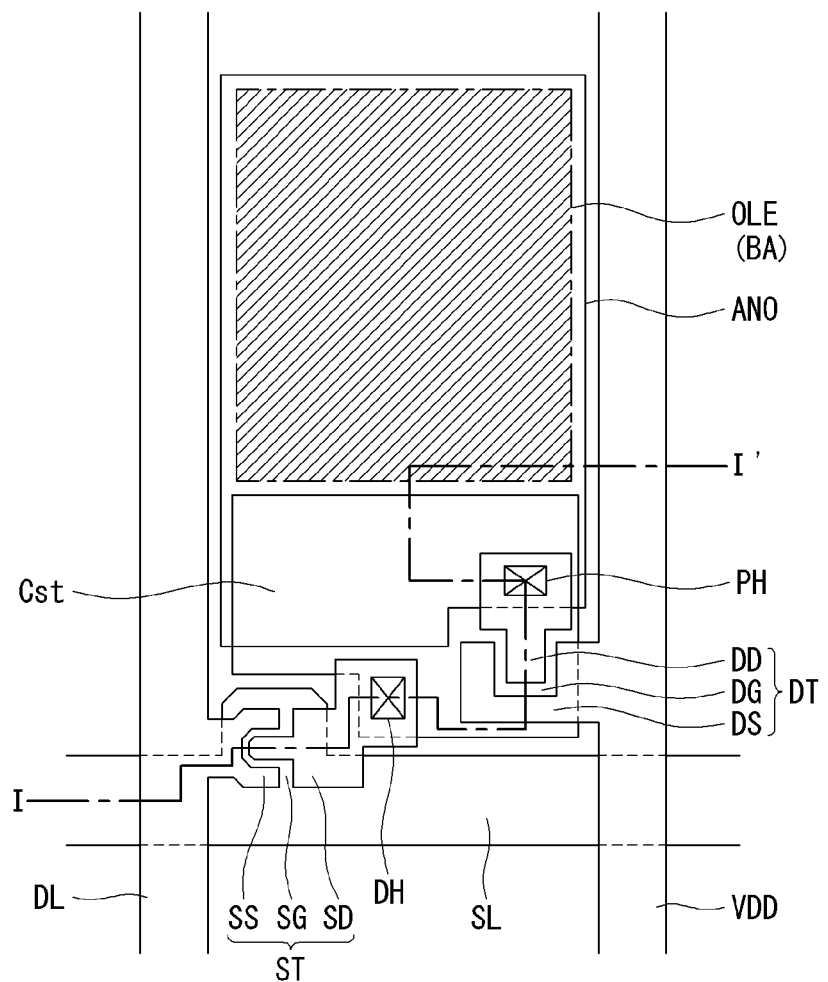
FIG. 3 is a plane view illustrating the structure of one pixel in the AMOLED according to the related art.
Figure 4:
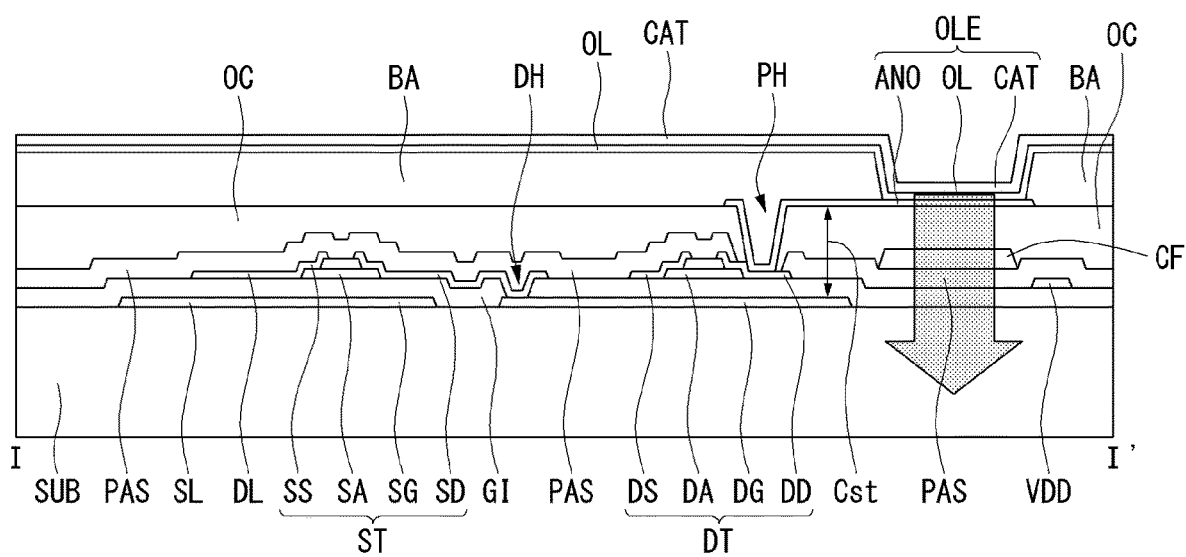
FIG. 4 is a cross sectional view along the cutting line I-I' for illustrating the structure of the bottom emission type AMOLED according to the related art.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 5:
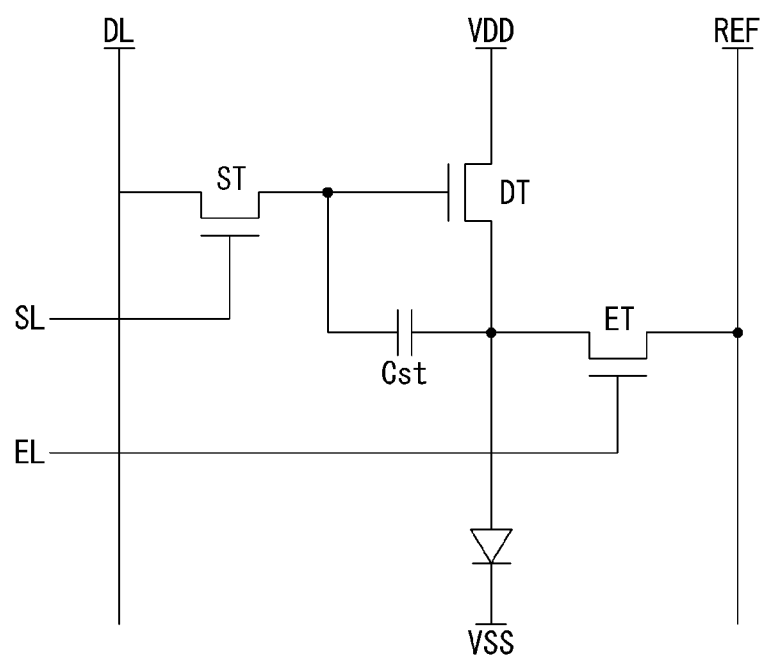
FIG. 5 is an equivalent circuit diagram illustrating a structure of one pixel in the organic light emitting diode display having a compensation element according to the present disclosure.

Hereinafter, referring to FIG. 5, we will explain about the present disclosure. FIG. 5 is an equivalent circuit diagram illustrating a structure of one pixel in an organic light emitting diode display having a compensation element according to the present disclosure. All the components of the organic light emitting diode display device according to all embodiments of the present disclosure are operatively coupled and configured.

Referring to FIG. 5, one pixel of the organic light emitting diode display comprises a switching thin film transistor ST, a driving thin film transistor DT, a storage capacitance Cst, a compensation element and an organic light emitting diode OLE. The compensation element may be configured in a various method. Here, we explain about the case that the compensation element includes a sensing thin film transistor ET and a sensing line REF.

Responding to the scan signal supplied from the scan line SL, the switching thin film transistor ST works as a switching operation for storing the data signal from the data line DL to the storage capacitance Cst as the data voltage. According to the data voltage in the storage capacitance Cst, the driving thin film transistor DT works for supplying the driving current between the driving current line VDD (supplying the variable high level voltage) and the base voltage line VSS (supplying the constant low level voltage). The organic light emitting diode OLE works as generating the lights according to the driving current formed by the driving thin film transistor DT.

The sensing thin film transistor ET is an additional element disposed within the pixel area for compensating the threshold voltage of the driving thin film transistor DT. The sensing thin film transistor ET is connected between the drain electrode of the driving thin film transistor DT and the anode electrode (the sensing node) of the organic light emitting diode OLE. The sensing thin film transistor ET works for supplying the initial voltage (the sensing voltage) from the sensing line REF to the sensing node or for detecting (sensing) the voltage or current at the sensing node.

The switching thin film transistor ST includes a source electrode connected to the data line DL, and a drain electrode connected to the gate electrode of the driving thin film transistor DT. The driving thin film transistor DT includes a source electrode connected to the driving current line VDD, and a drain electrode connected to anode electrode of the organic light emitting diode OLE. The storage capacitance Cst includes a first electrode connected to the gate electrode of the driving thin film transistor DT, and a second electrode connected to the anode electrode of the organic light emitting diode OLE.

The organic light emitting diode OLE includes an anode electrode connected to the drain electrode of the driving thin film transistor DT, and a cathode electrode connected to the base voltage line VSS. The sensing transistor ET includes a source electrode connected to the sensing line REF, and a drain electrode connected to the sensing node (the anode electrode of the organic light emitting diode OLE).

The operating timing of the sensing thin film transistor ET may be related to that of the switching thin film transistor ST according to the compensation algorithm. For example, as shown in FIG. 5, the gate electrode of the switching thin film transistor ST is connected to one scan line SL, and the gate electrode of the sensing thin film transistor ET is connected to the sensing gate line EL. Otherwise, the gate electrodes of the switching thin film transistor ST and the sensing thin film transistor ET may be connected to the scan line SL commonly.

According to the sensing results, the digital type data signal, the analog type data signal or gamma signal may be compensated. The compensation elements for generating the compensating signal (the compensating voltage) based on the sensing results may be configured as the internal circuits embedded into the data driver or timing controller or the externally circuits.

FIG. 5 shows a pixel having the structure of 3T1C (three thin film transistor and one capacitance) including the switching thin film transistor ST, the driving thin film transistor DT, the sensing thin film transistor ET, the storage capacitance Cst and the organic light emitting diode OLE. Otherwise, the pixel may include additional compensating elements for example, 3T2C, 4T2C, 5T1C, 6T2C, etc.

Hereinafter, we will explain about the structural features of the ultra high resolution organic light emitting diode display configured with the circuit diagram shown in FIG. 5 according to the present disclosure. Hereinafter, we will explain about various structures of the organic light emitting diode display according to the present disclosure.

First Embodiment

Figure 6:
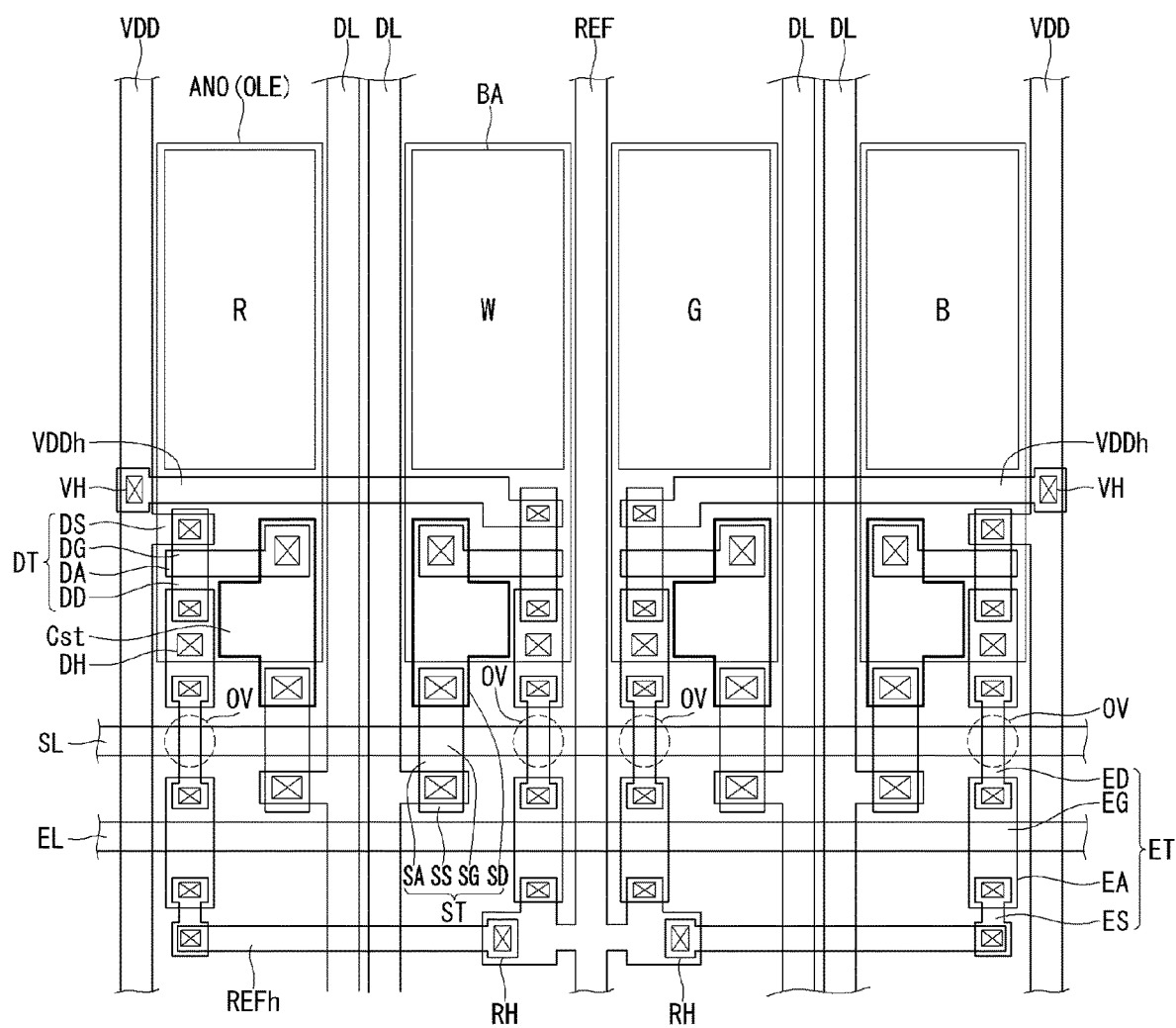
FIG. 6 is a plane view illustrating a structure of an organic light emitting diode display having a compensation element according to a first embodiment of the present disclosure.

Referring to FIG. 6, we will explain about the first embodiment of the present disclosure. FIG. 6 is a plane view illustrating a structure of an organic light emitting diode display having a compensation element according to the first embodiment of the present disclosure.

Referring to FIG. 6, the organic light emitting diode display according to the first embodiment of the present disclosure comprises a sensing line REF, a data line DL and a driving current line VDD which are running to a vertical (first) direction, and a horizontal sensing line REFh, a horizontal current line VDDh, a scan line SL and a sensing gate line EL which are running to a horizontal (second) direction on a substrate SUB. These lines define the pixel areas. In detail, one pixel area is defined as an area surrounded by two neighboring horizontal sensing lines REFh, one data line DL and one driving current line VDD or one data line DL and one sensing line REF.

The scan line SL, the sensing gate line EL, the horizontal sensing line REFh and the horizontal current line VDDh are running in horizontal direction on the substrate SUB. The data line DL, the driving current line VDD and the sensing line REF are running in vertical direction on the substrate SUB. The horizontal sensing line REFh is connected to the sensing line REF via a sensing contact hole RH. The horizontal current line VDDh is connected to the driving current line VDD via the current contact hole VH.

In the organic light emitting diode display according to the first embodiment of the present disclosure, one unit pixel comprises four sub pixels including a red pixel R, a white pixel W, a green pixel G and a blue pixel B. A plurality of unit pixels, each unit pixel including four sub pixels, is arrayed in a matrix manner. One unit pixel is defined between two neighboring sensing gate lines EL (horizontal sensing lines REFh) along to the vertical direction, and between two neighboring driving current lines VDD in the along to the horizontal direction.

Four sub pixels are arrayed as two of them are disposed at the left side and other two are disposed at the right side based on the sensing line REF, having the symmetry structure. The horizontal sensing line REFh is branched out or linked to the sensing line REF and extended to the two sub pixels at the left side and to the other two sub pixels at the right side from the sensing line REF.

Within one unit pixel area, the area between the horizontal current line VDDh and the horizontal sensing line REFh of the current pixel is defined as the non-emission area. In the non-emission area, the thin film transistors ST, DT and ET and the storage capacitance Cst are disposed. An anode electrode ANO of an organic light emitting diode OLE is disposed in the area between the horizontal current line VDDh and the upper horizontal sensing line REFh of the upper pixel. The anode electrode ANO has an emission area which is defined by a bank BA. Within the emission area, the organic light emitting diode OLE is formed.

The switching thin film transistor ST includes a switching source electrode SS connected to the data line DL, a switching gate electrode SG defined at a part of the scan line SL, a switching semiconductor layer SA and a switching drain electrode SD. A channel area is defined at the overlapped area of the switching semiconductor layer SA with the switching gate electrode SG. As the switching semiconductor layer SA is disposed as crossing the scan line SL from the lower side to the upper side, the switching thin film transistor ST is formed.

The sensing thin film transistor ET includes a sensing source electrode ES connected to the horizontal sensing line REFh, a sensing gate electrode EG defined at a part of the sensing gate line EL, a sensing semiconductor layer EA and a sensing drain electrode ED. A channel area is defined at the overlapped area of the sensing semiconductor layer EA with the sensing gate electrode EG. As the sensing semiconductor layer EA is disposed as crossing the sensing gate line EL from the lower side to the upper side, the sensing thin film transistor ET is formed.

The driving thin film transistor DT includes a driving source electrode DS branched from the driving current line VDD or defined at a part of the horizontal current line VDDh, a driving gate electrode DG connected to the switching drain electrode SD, a driving semiconductor layer DA and a driving drain electrode DD. A channel area is defined at the overlapped area of the driving semiconductor layer DA with the driving gate electrode DG. As the driving semiconductor layer DA is disposed as crossing the driving gate electrode DG from the driving source electrode DS to the scan line SL, the driving thin film transistor DT is formed. The driving drain electrode DD is connected to the one portion of the driving semiconductor layer DA and one portion of the sensing semiconductor layer EA.

The storage capacitance Cst includes a first electrode and a second electrode. The first electrode is formed as some expanded portions of the switching drain electrode SD. The second electrode is formed as some portions of the driving drain electrode DD or some portions of the anode electrode ANO. Here, in convenience, the second electrode is formed as some portions of the anode electrode ANO overlapped with the first electrode.

The driving thin film transistor DT and the storage capacitance Cst are disposed between the horizontal current line VDDh and the scan line SL. Further, the switching thin film transistor ST and the sensing thin film transistor ET are disposed between the scan line SL and the horizontal sensing line REFh. The driving elements are disposed between the horizontal current line VDDh and the horizontal sensing line REFh. This area is defined as the non-emission area.

The anode electrode ANO of the organic light emitting diode OLE is connected to the driving drain electrode DG through the pixel contact hole PH. The open area of the bank BA is defined as exposing a maximum area of the anode electrode ANO.

Most parts of the anode electrode ANO are exposed by the bank BA. The organic light emitting diode OLE is formed by stacking the organic light emitting layer and the cathode electrode on the bank BA. It is preferable that the organic light emitting diode OLE is formed as having the maximum emission area within the pixel area.

FIG. 6 shows an organic light emitting diode display in which the open area of the bank BA is not overlapped with the thin film transistors ST, DT and ET. In this case, the organic light emitting diode display is the bottom emission type. For the case of the top emission type, the open area of the bank BA may include the area of the anode electrode ANO covering the thin film transistors ST and DT and storage capacitance Cst. Further, the anode electrode ANO may be extended to the horizontal sensing line REFh and the open area of the bank BA may be defined as covering the sensing thin film transistor ET.

The organic light emitting diode display shown in FIG. 6 has the structure having the compensation elements. The configuration of the thin film transistors is very complex and various elements are formed. In every pixel area, the sensing drain electrode ED of the sensing thin film transistor ET is overlapped with the scan line SL. With this structure, a parasitic capacitance should be formed at the overlapped area OV between the scan line SL and the sensing drain electrode ED. This parasitic capacitance is one of main element for causing the delay of the scan signal. As the scan signal is delayed, all switching thin film transistors ST connected to the same scan line SL are not simultaneously activated, but they may be sequentially activated with time delays.

Second Embodiment

Figure 7:
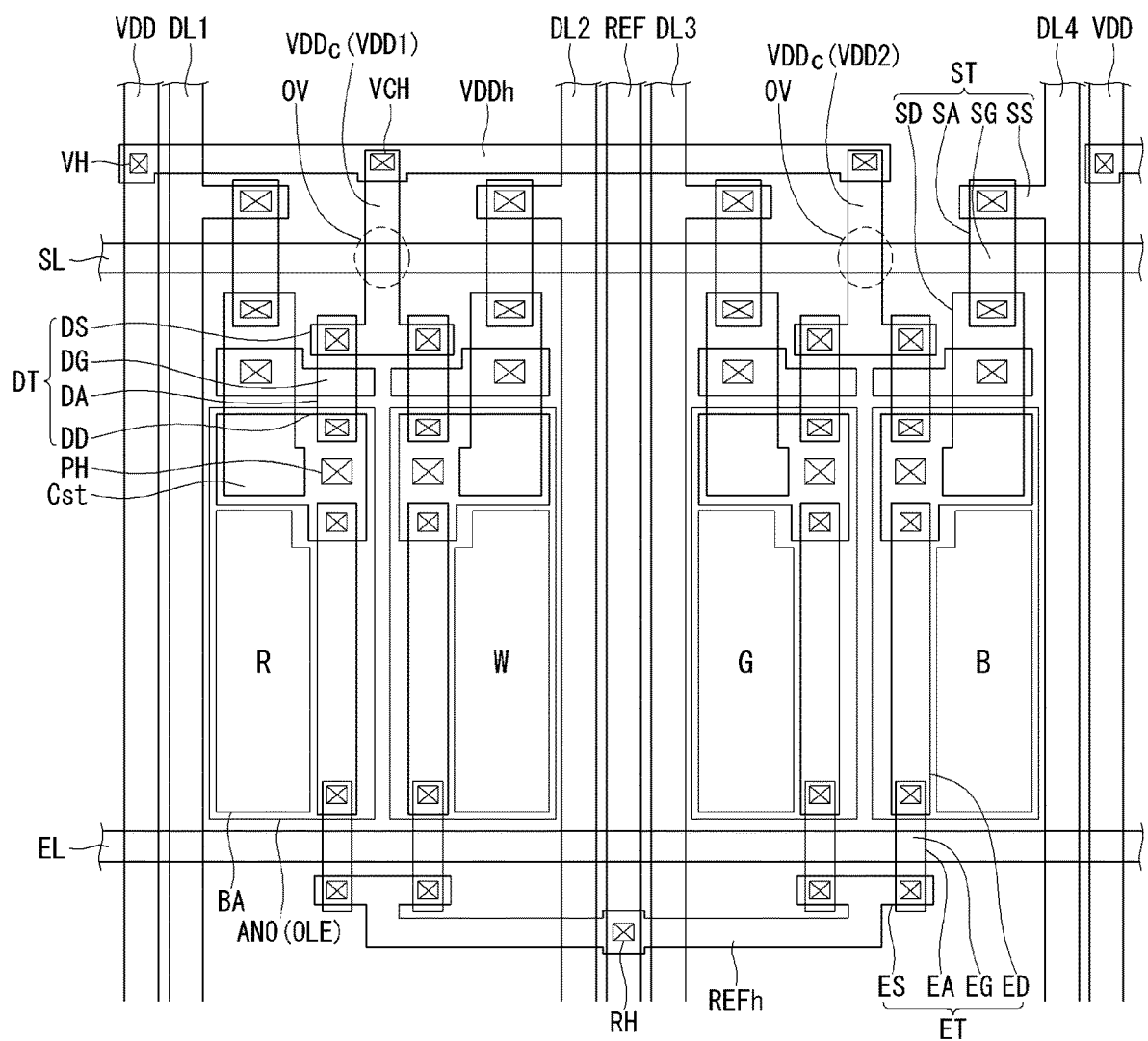
FIG. 7 is a plane view illustrating a structure of an ultra high density organic light emitting diode display having a compensation element and reducing the load of the scan line according to a second embodiment of the present disclosure.

Hereinafter, referring to FIG. 7 we will explain about an organic light emitting diode display according to the second embodiment in which the parasitic capacitance at the scan line SL is minimized. FIG. 7 is a plane view illustrating a structure of an ultra high density organic light emitting diode display having a compensation element and reducing the load of the scan line according to the second embodiment of the present disclosure.

In the second embodiment, we provide an organic light emitting diode display in which the number of the lines or electrodes crossing or overlapping with the scan line SL is minimized. Rather, if the crossing structure is required, they may be crossing or overlapping with the driving current line VDD which supplies a constant direct current.

Referring to FIG. 7, the scan line SL, the sensing gate line EL, the horizontal sensing line REFh and the horizontal current line VDDh are running in horizontal direction on the substrate SUB. The data line DL, the driving current line VDD and the sensing line REF are running in vertical direction on the substrate SUB. The horizontal sensing line REFh is connected to the sensing line REF via a sensing contact hole RH. The horizontal current line VDDh is connected to the driving current line VDD via the current contact hole VH. One pixel area may be defined by the sensing gate line EL, the horizontal sensing line REFh and the horizontal current line VDDh which are running in horizontal direction, and the data line DL, the driving current line VDD and the sensing line REF which are running in vertical direction.

In the organic light emitting diode display according to the second embodiment of the present disclosure, one unit pixel comprises four sub pixels including a red pixel R, a white pixel W, a green pixel G and a blue pixel B. A plurality of unit pixels, each unit pixel including four sub pixels, is arrayed in a matrix manner. For example, one unit pixel including 4 sub pixels may be defined as surrounding by two neighboring horizontal sensing lines REFh along to the vertical direction, and two neighboring driving current lines VDD along to the horizontal direction. Further, two sub pixels are disposed between the driving current line VDD and the sensing line REF.

Four sub pixels are arrayed as two of them are disposed at the left side and other two are disposed at the right side based on the sensing line REF, having the symmetry structure. The horizontal sensing line REFh is branched out or linked to the sensing line REF and extended to the two sub pixels at the left side and to the other two sub pixels at the right side from the sensing line REF.

The pixel array in which two sub pixels are disposed between the driving current line VDD and the sensing line REF are bi-symmetrically arrayed based on the sensing line REF. Hereinafter, we will explain as focusing on the two sub pixel areas disposed between the driving current line VDD and the sensing line REF.

A first data line DL1 is disposed as being close to the pixel area side from the driving current line VDD. The first data line DL1 supplies the data signal to the organic light emitting diode allocated at the first pixel area. A second data line DL2 is disposed as being close to the pixel area side from the sensing line REF. The second data line DL2 supplies the data signal to the organic light emitting diode allocated at the second pixel area.

The horizontal current line VDDh connected to the driving current line VDD is extended as crossing the two pixel areas. Further, the horizontal current line VDDh is extended to the middle portion of the neighboring two pixel areas. Hereinafter, in convenience, we will explain about the first pixel area. The second pixel area has the bi-symmetrical shape with the first pixel area.

The scan line SL is disposed next to the horizontal current line VDDh along to the vertical direction. The sensing gate line EL I disposed next to the scan line SL along to the vertical direction. The different point with the first embodiment, the scan line SL is disposed as being relatively closed to the horizontal current line VDDh, but being relatively far from the sensing gate line EL. The scan thin film transistor ST is disposed between the horizontal current line VDDh and the scan line SL. The driving thin film transistor DT, the storage capacitance Cst and the sensing thin film transistor ET are disposed between the scan line SL and the sensing gate line EL. In another case, the organic light emitting diode OLE may be further expanded between the scan line SL and the sensing gate line EL.

The switching thin film transistor ST is disposed as being crossing the scan line SL. The switching thin film transistor ST includes a switching source electrode SS, a switching gate electrode SG, a switching drain electrode SD and a switching semiconductor layer SA. Between the horizontal current line VDDh and the scan line SL, the switching source electrode SS branched from the first data line DL1 is disposed. The switching drain electrode SD is disposed as facing the switching source electrode SS with the scan line SL between them. The switching semiconductor layer SA is crossing the scan line SL from one end, the switching source electrode SS, to the other end, the switching drain electrode SD. The switching drain electrode SD is expanded to lateral direction for forming a first electrode of the storage capacitance Cst. The overlapped portions of the switching semiconductor layer SA with the scan line SL are defined as the channel area.

Between two neighboring pixel areas disposed between the driving current line VDD and the sensing line REF, a common current line VDDc is disposed. The common current line VDDc is branched from the horizontal current line VDDh along to the vertical direction within the pixel area. Specifically, the common current line VDDc is connected to the horizontal current line VDDh via a common current hole VCH.

The common current line VDDc supplies the driving current to the pixel area. In the present disclosure, four sub pixels form one unit pixel area. Specifically, in the second embodiment, the driving current is supplied to the four sub pixels with two common current lines VDDc. In detail, a first common current line VDD1 supplies the driving current to the first sub pixel area and the second sub pixel area, commonly. A second common current line VDD2 supplies the driving current to the third sub pixel area and the fourth sub pixel area, commonly.

The common current line VDDc has a vertical segment disposed between two sub pixel areas as crossing the scan line SL. At every four sub pixel areas, only two common current lines VDDc, the first common current line VDD1 and the second common current line VDD2, are required for supplying the driving current to the four sub pixels. That is only two common current lines, the first common current line VDD1 and the second common current line VDD2, are overlapped with the scan line SL.

The driving thin film transistor DT is disposed between the scan line SL and the sensing gate line EL. The driving thin film transistor DT includes a driving source electrode DS, a driving gate electrode DG, a driving drain electrode DD, and a driving semiconductor layer DA. The driving source electrode DS is branched from the first common current line VDD1 to the first pixel area. The driving gate electrode DG is disposed near to the driving source electrode DS. The driving gate electrode DG is connected to the switching drain electrode SD. The driving drain electrode DD is facing the driving source electrode DS with the driving gate electrode DG between them. The driving drain electrode DD may be expanded in lateral direction for forming the second electrode of the storage capacitance Cst. The overlapped portions of the driving semiconductor layer DA with the driving gate electrode DG are defined as the channel area.

The sensing thin film transistor ET is disposed as crossing the sensing gate line EL from the horizontal sensing line REFh. The sensing thin film transistor ET includes a sensing source electrode ES, a sensing gate electrode EG, a sensing drain electrode ED and a sensing semiconductor layer EA. The sensing source electrode ES branched from the horizontal sensing line REFh is disposed under the sensing gate line EL. The sensing drain electrode ED is disposed as facing the sensing source electrode ES with the sensing gate line EL between them. The sensing semiconductor layer EA is crossing the sensing gate line EL from one end, the sensing source electrode ES, to the other end, the sensing drain electrode ED. The overlapped portions of the sensing semiconductor layer EA with the sensing gate line EL are defined as the channel area. The sensing drain electrode ED is connected to the driving drain electrode DD.

The storage capacitance Cst includes a first electrode and a second electrode. The first electrode is formed as expanding some of the switching drain electrode SD. The second electrode is formed with some of the driving drain electrode DD or some of the anode electrode ANO. Here, the second electrode is formed with the driving drain electrode DD expanded as overlapping with the first electrode.

The anode electrode ANO of the organic light emitting diode is connected to the driving drain electrode DD via the pixel contact hole PH. The bank BA has an open area exposing maximum area of the anode electrode ANO. Most portions of the anode electrode ANO is exposed by the bank BA. The organic light emitting diode OLE is formed as stacking the organic light emitting layer and the cathode electrode sequentially on the anode electrode ANO and bank BA. It is preferable that the organic light emitting diode has the maximum area within the pixel area.

The first sub pixel area and the second sub pixel area are disposed between the driving current line VDD and the sensing line REF. The first sub pixel area and the second sub pixel area are disposed as having the bi-symmetric shape (mirror symmetric shape) each other based on the common current line. Further, the third sub pixel area and the fourth sub pixel area are disposed as having the bi-symmetrical shape with the first and the second sub pixel areas, based on the sensing line REF. With this structure, a red pixel R may be allocated at the first sub pixel area, a white pixel W may be allocated at the second sub pixel area, a green pixel G may be allocated at the third sub pixel area and a blue pixel B may be allocated at the fourth sub pixel area.

In the organic light emitting diode display as shown in FIG. 7, the open area of the bank BA is not covering the thin film transistors ST, DT and ET. In that case, the organic light emitting diode display is the bottom emission type. For the case of the top emission type, the open area of the bank BA may include the area of the anode electrode ANO covering the driving thin film transistor DT and storage capacitance Cst. Further, the anode electrode ANO may be extended to the horizontal current line VDDh and the open area of the bank BA may be defined as covering the switching thin film transistor ST.

Comparing with the first embodiment, the organic light emitting diode display according to the second embodiment has the structure in which the number of overlap area OV by the lines or electrodes crossing the scan line SL is reduced in half. Therefore, the amount of the parasitic capacitances formed at the scan line SL by being overlapped with the lines or electrodes is reduced in half. As the results, the load to the scan line SL is reduced so that the scan signal can be applied to all thin film transistors connected to the same scan line SL without time delay. By applying the structure of the second embodiment to the large area organic light emitting diode display, we can get a large area ultra high density organic light emitting diode display having the superior video quality.

While the embodiments of the present invention have been described in detail with reference to the drawings, it will be understood by those skilled in the art that the disclosure can be implemented in other specific forms without changing the technical spirit or essential features of the disclosure. Therefore, it should be noted that the forgoing embodiments are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flat panel display device comprising:
   a driving current line extending in a first direction;
   a sensing line extending in the first direction and configured to supply an initial voltage to a sensing node in a pixel circuit for detecting a voltage or a current at the sending node;
   a scan line extending in a second direction;
   a sensing gate line extending in the second direction;
   a horizontal current line extending in the second direction and connected to the driving current line;
   a common current line branched from the horizontal current line and crossing the scan line;
   a first pixel area and a second pixel area disposed between the driving current line and the sensing line as having a bi-symmetric shape with each other based on the common current line;
   a switching thin film transistor overlapped with the scan line;
   a driving thin film transistor disposed between the scan line and the sensing gate line, and connected to the switching thin film transistor; and
   a sensing thin film transistor overlapped with the sensing gate line.

2. The flat panel display device according to claim 1, wherein the switching thin film transistor includes:
   a switching source electrode branched from a data line;
   a switching drain electrode facing the switching source electrode based on the scan line; and
   a switching semiconductor layer crossing the scan line,
   wherein one end of the switching semiconductor layer is connected to the switching source electrode and another end of the switching semiconductor layer is connected to the switching drain electrode.

3. The flat panel display device according to claim 2, wherein the driving thin film transistor includes:
   a driving source electrode branched from the common current line;
   a driving gate electrode connected to the switching drain electrode;
   a driving drain electrode facing the driving source electrode based on the driving gate electrode; and
   a driving semiconductor layer crossing the driving gate electrode,
   wherein one end of the driving semiconductor layer is connected to the driving source electrode and another end of the driving semiconductor layer is connected to the driving drain electrode.

4. The flat panel display device according to claim 3, further comprising:
   a horizontal sensing line disposed at a lower side of the sensing gate line in the second direction and connected to the sensing line,
   wherein the sensing thin film transistor includes:
   a sensing source electrode branched from the horizontal sensing line;
   a sensing drain electrode facing the sensing source electrode based on the sensing gate line, and connecting to the driving drain electrode; and
   a sensing semiconductor layer crossing the sensing gate line,
   wherein one end of the sensing semiconductor layer is connected to the sensing source electrode and another end of the sensing semiconductor layer is connected to the sensing drain electrode.

5. The flat panel display device according to claim 1, further comprising:
   an anode electrode connected to the driving thin film transistor and disposed within the first pixel area;
   a bank defining an emission area within the anode electrode;
   an organic light emitting layer disposed on the emission area; and
   a cathode electrode disposed on the organic light emitting layer.

6. The flat panel display device according to claim 1, further comprising:
   a third pixel area and a fourth pixel area disposed as having a bi-symmetric shape with the first pixel area and the second pixel area based on the sensing line.

7. The flat panel display device according to claim 6, wherein a red pixel is allocated at the first pixel area,
   a white pixel is allocated at the second pixel area,
   a green pixel is allocated at the third pixel area, and
   a blue pixel is allocated at the fourth pixel area.

8. The flat panel display device according to claim 6, wherein the common current line includes:
   a first common current line supplying a driving current to the first pixel area and the second pixel area; and
   a second common current line supplying the driving current to the third pixel area and the fourth pixel area.

9. The flat panel display device according to claim 8, wherein the first common current line and the second common current line are overlapped with the scan line within an unit pixel area including the first pixel area, the second pixel area, the third pixel area and the fourth pixel area.

10. The flat panel display device according to claim 1, further comprising:
    a sensing thin film transistor connected between the driving current line and the sensing line,
    wherein the sensing gate line is connected to a gate electrode of the sensing thin film transistor.

11. The flat panel display device according to claim 1, further comprising:
    a horizontal sensing line extending in the second direction and connected to the sensing line.

12. The flat panel display device according to claim 1, wherein the first pixel area and a second pixel area are located between the scan line and the sensing gate line.

13. The flat panel display device according to claim 1, wherein the common current line is parallel to the driving current line and the sensing line.

14. The flat panel display device according to claim 1, wherein the first pixel area and the second pixel area have mirror symmetry based on the common current line.

15. The flat panel display device according to claim 1, wherein the sensing thin film transistor is electrically connected between the driving thin film transistor and the sensing line, and the sensing thin film transistor includes a gate electrode connected to the sensing line.

16. The flat panel display device according to claim 1, wherein the switching thin film transistor and the sensing thin film transistor are disposed at opposite sides of the first pixel area.

17. The flat panel display device according to claim 16, wherein the driving thin film transistor is disposed in a region between the switching thin film transistor and the sensing thin film transistor, and
   wherein the driving thin film transistor is located closer to the switching thin film transistor than the sensing thin film transistor.

18. The flat panel display device according to claim 1, further comprising:
   a capacitor including a first electrode connected between the switching thin film transistor and the driving thin film transistor and a second electrode connected between the driving thin film transistor and a light emitting element,
   wherein the switching thin film transistor and the driving thin film transistor are both disposed at a first side of the capacitor, and the sensing thin film transistor is disposed at a second side of the capacitor, the second side being opposite to the first side.

* * * * *